United States Patent [19]

Young et al.

[11] 4,418,316

[45] Nov. 29, 1983

[54] NUCLEAR MAGNETIC RESONANCE APPARATUS

[75] Inventors: Ian R. Young, Sunbury-on-Thames; Godfrey N. Hounsfield, Newark; Michael Burl, Iver, all of England

[73] Assignee: Picker International Limited, Wembley, England

[21] Appl. No.: 265,152

[22] Filed: May 19, 1981

[30] Foreign Application Priority Data

May 21, 1980 [GB] United Kingdom ............... 8016807

[51] Int. Cl.³ ........................................... G01R 33/08
[52] U.S. Cl. ..................................... 324/309; 324/301
[58] Field of Search ................. 324/300, 301, 307–315

[56] References Cited

U.S. PATENT DOCUMENTS

| | | | |
|---|---|---|---|
| 3,274,485 | 9/1966 | Denis et al. | 324/301 |
| 3,404,332 | 10/1968 | Abragam | 324/301 |
| 4,209,746 | 6/1980 | Abramov | 324/301 |

FOREIGN PATENT DOCUMENTS

| | | |
|---|---|---|
| 1471531 | 4/1977 | United Kingdom . |
| 1578910 | 5/1978 | United Kingdom . |
| 1584948 | 5/1978 | United Kingdom . |
| 1584949 | 5/1978 | United Kingdom . |
| 1584950 | 5/1978 | United Kingdom . |

Primary Examiner—Michael J. Tokar
Attorney, Agent, or Firm—Fleit, Jacobson, Cohn & Price

[57] ABSTRACT

In nuclear magnetic resonance (NMR) imaging systems it is known to excite resonance in a slice of a body and then to sample the resonance signals in the presence of a field gradient across the slice. It has been proposed that the signals should be sampled at intervals such that there is equal field integral (for the field gradient) in each interval. It is now proposed to use outputs from two NMR probes in the slice and on opposite sides of the body. The phase difference between the two probes is measured and samples are taken when the phase difference reaches a predetermined value. Preferably the samples are taken when a gate detects zero-crossing of the output of a demodulator providing the phase difference. Two probes only may be rotated around the patient as the field gradient rotates or four may be used, two orthogonally disposed pairs and one or other appropriately weighted output used.

9 Claims, 4 Drawing Figures

NUCLEAR MAGNETIC RESONANCE APPARATUS

The present invention relates to systems for investigating the distribution of a quantity, in a chosen region of a body, by nuclear magnetic resonance (NMR) techniques.

Nuclear magnetic resonance is known for the analysis of materials, particularly by spectroscopy. It has been suggested that the techniques be applied to medical examination to provide distributions of density of chosen nuclei, for example protons, or of relaxation time constants in sectional slices or volumes of patients. Such distributions are similar to, although of different significance from, the distributions of X-ray attenuation provided by computerised tomography (CT) systems.

Practical NMR apparatuses operate by applying suitable combinations of magnetic fields to the body being examined, via magnet (coil) systems, and detecting induced current in one or more detector coil systems. A suitable sequence of pulsed magnetic fields and apparatus to operate that sequency have been devised and, together with other improvements and related inventions, are disclosed and claimed in U.S. Pat. Nos. 4,254,778, 4,315,216, 4,284,948, 4,300,096 British patent application No. 22294/78 and U.S. Pat. No. 4,284,950.

In that arrangement a basic steady magnetic field is applied in a direction usually parallel to the axis of the patient's body. Other magnetic fields are then applied to cause resonance in a chosen cross-sectional slice of the patient. The resonance signal from the slice can then be detected. As it is detected there is applied a further field having a gradient in a chosen direction in the plane of the slice. This causes dispersion of the resonance frequencies in that direction and consequent phase dispersion in the resonance signal detected.

Frequency analysis of this signal, generally by Fourier Transformation, yields a plurality of resonance signals each for a different one of a plurality of strips perpendicular to the direction of the gradient. For analysis by CT techniques, known for x-rays, this procedure is repeated for many different directions of the gradient to provide a plurality of sets of signals for sets of strips in different directions.

In a practical system this gradient pulse is not applied as a square pulse but is of another shape, such as a distorted sinusoid, to suit practical considerations.

The foregoing method uses a circular $(r, \theta)$ geometry as the direction of the gradient is rotated about an axis through the slice. Other arrangements, however may be used, for example that described in U.S. Pat. No. 4,355,282, which uses a rectangular (x,y) geometry.

In U.S. Pat. No. 4,315,216 it is disclosed that in such systems using field gradients during detection it is desirable to sample the resonance signal at intervals such that the gradient field integral, and therefore the change of phase of the resonance signal, is equal for each such interval. Such sampling is at unequal intervals of time and for that reason the technique has been identified as "non-linear" or "stretch-time" sampling. In U.S. Pat. No. 4,315,216 there are disclosed arrangements for achieving sampling at the correct intervals.

It is an object of this invention to provide an alternative arrangement for the purpose of achieving the non-linear sampling of the system described in U.S. Pat. No. 4,315,216.

According to the invention there is provided, for an NMR apparatus using a field gradient to produce phase dispersion of resonating nuclei in a selected region of a body, a sampling arrangement for determining sampling times spaced such that the gradient field integral in each interval between sampling times is substantially equal, the arrangement including two NMR probes displaced in the direction of said gradient to produce NMR signals at frequencies representing the fields at their respective positions, means for determining the phase difference between signals from the probes and means producing a sampling signal each time the phase difference attains a predetermined value.

In order that the invention may be clearly understood and readily carried into effect it will now be described by way of example with reference to the accompanying drawings, of which FIG. 1 shows a circuit for the probe arrangement of the invention in conjunction with an NMR signal handling system, FIG. 2 shows a suitable NMR probe.

The sampling procedure described in U.S. Pat. No. 4,315,216 envisages that the sampling times may be precalculated or measured and stored in a suitable memory. Alternatively, however, it is envisaged that the field may be measured and a sample initiated each time the required field integral is reached.

In the embodiment described in the aforementioned patents field sensing probes are provided for a variety of purposes and it is suggested that one of these may be used to measure the field for sampling timing purposes. The probes may typically be NMR probes each comprising a small volume of water with coils wound around it and they can, if the linear dimension of the volume is sufficiently small in the direction of the gradient vector, be used themselves for field measurement and therefore for determining sampling times.

The procedure for operating an NMR probe is that known for any NMR apparatus, namely the resonance signal picked up in the coil surrounding the sample is demodulated with a reference signal from a master oscillator at a known frequency with a relation to the exciting frequency.

It has been proposed in our co-pending application identified by U.S. patent application Ser. No. 265,211 filed May 19, 1981 to demodulate against the signal from one of the NMR field probes.

It is proposed in this invention to use two NMR probes spaced at a suitable distance. Provided that the probes are sufficiently small that they do not have more than about a $\pi/4$ phase change across their widths then they can be used effectively to demodulate one another.

For one pair displaced in the direction of the field gradient the probe output will start in phase as the gradient is applied and there will be a continuing change in the relative phase of the output during the gradient pulse. If the outputs are applied to a phase sensitive rectifier the output of the rectifier will show modulation. The phase difference between them can be measured and at equal increments of phase difference samples can be taken.

In the preferred embodiment of the invention samples are taken each time the modulated output changes sign. This sampling rate may be increased perhaps by multiplying the output frequency. It is, however, also adjustable by varying the spacing between the probes. Generally the probes are outside the working region in which the patient is placed and on opposite sides of it but otherwise preferably as closely spaced as possible.

Figure 1:
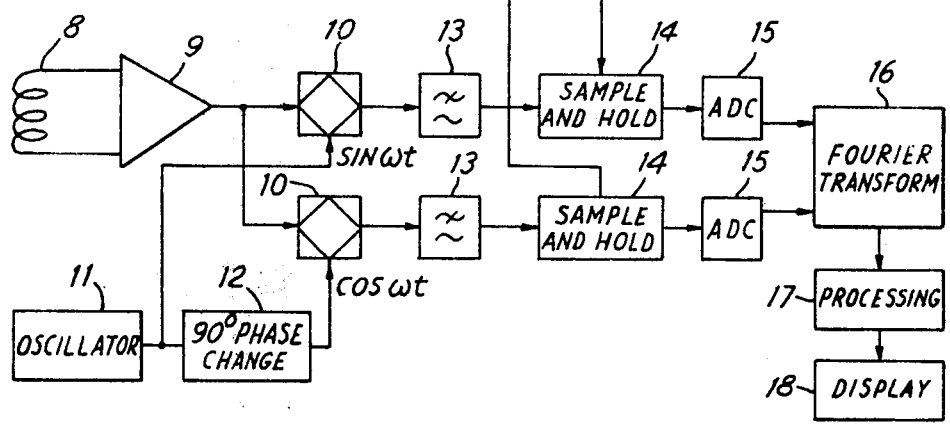

FIG. 1 shows a circuit for the preferred embodiment of the invention. Two probes 1 are shown schematically as containers of water having coils around them. The design of the probes is relatively straightforward but it should be noted that the water samples should have a dimension in the direction of measurement which is comparable with or less than the desired resolution of the apparatus. A typical probe shown in FIG. 2 has a suitably small dimension in one direction but a small hole (say 2 mm diameter by 50 mm long) drilled in a block of a suitable plastic can be of suitably small dimension in all directions in a plane and that is required if the field rotates relative to the probes.

Returning to FIG. 1, the probe outputs are amplified at amplifiers 2 and one is put through a variable delay 3. This is not essential but serves to provide adjustment of the relative starting phase.

The two outputs at frequencies $f_1$ and $f_2$ are applied to a demodulator 4 which provides an output at the difference frequency $(f_2-f_1)$. As mentioned, in the preferred embodiment it is desired to sample at the zero crossings of the difference frequency signal and so this signal is applied to two monostable circuits 5 and 6 which are triggered by rising and falling voltages respectively. The monostable outputs become inputs to an exclusive OR gate 7 which then itself has an output pulse at each zero crossing of the difference frequency $(f_2-f_1)$. Each output pulse is used to initiate a sample of the NMR signal from the detector coils of the main apparatus as described in said co-pending patents and applications.

FIG. 1 also includes the signal handling circuits for one form of the NMR apparatus described in said co-pending patents and applications although it is emphasized that those circuits do not form part of this invention and in fact this invention can be used to control sampling in other NMR apparatuses. The main signal sensing coils 8 and head amplifier 9 supply the NMR signals during the pulsed field gradient to demodulators 10. Since phase information is generally required these demodulators use sine and cosine signals from a master oscillator 11 and 90° phase shift circuit 12. After low pass filtering by filters 13 they are sampled in conventional sample and hold circuits 14 in response to the timing signals supplied by the circuits of this invention. The samples are digitised in analogue to digital converters 15, Fourier transformed at 16 and subject to the said CT type of processing at 17 for display at 18.

Since this two probe system is clearly directional it was suggested hereinbefore that the probes should be disposed in the direction of the field gradient. In some types of NMR apparatus the fields have x-y geometry so that measurement of field integrals to determine sampling time is only required in these two orthogonal directions. It will be clear then that two pairs of probes 90° displaced will suffice, the sample times being derived from one or other pair according to the relevant direction of the field gradient. In other types of NMR apparatus a circular $(r-\theta)$ geometry is used with the direction of the field gradient being rotated about an axis through the apparatus. Thus samples will need to be determined for gradients in many different directions, although generally all in a single plane.

Figure 3:
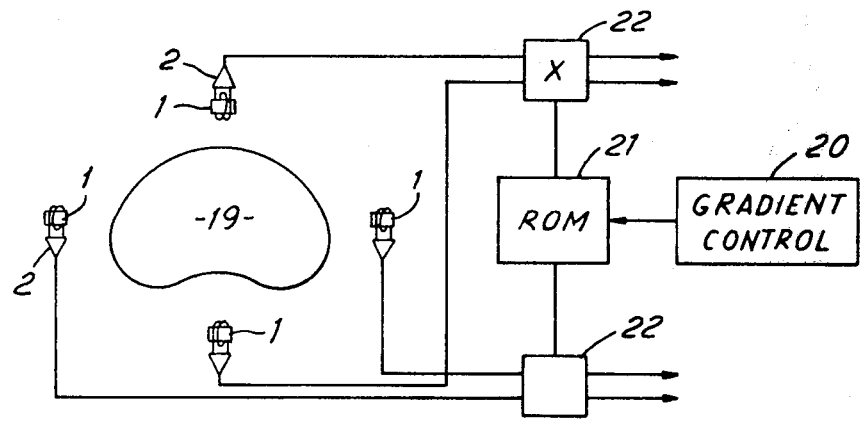
FIG. 3 shows a four probe arrangement for a rotating gradient.

Clearly two probes can be used provided the field gradient has a component in their direction of displacement. Therefore two pairs of probes at 90° to each other will suffice. Two such pairs of probes 1 are shown in FIG. 3 disposed around a patient's body 19. The output is selected from that pair which is closest to being aligned with the direction of the gradient (i.e. <45° from it).

Provided the probes can detect a sufficiently great difference in the direction of the gradient it would not appear to matter if they are properly aligned with the gradient or not. The system shown in FIG. 1 will still provide samples at equal field integrals. However the NMR systems generally require that the sampling intervals should not only be equal (in terms of field integral) at one direction of the gradient but should be the same for all directions of it. Angular displacement of the probes, however, reduces the field and therefore reduces the field integrals between zero crossings of $(f_2-f_1)$. To compensate for this, as the direction of the field gradient is rotated the probe outputs may be multiplied by factors related to the angular displacement.

In a practical apparatus rotation of the field gradient is achieved by varying the currents to orthogonal coil pairs and the values of currents required are generally held in read only memories in a gradient control circuit 20.

As shown in FIG. 3 a read only memory (ROM) 21 holds the correct factors for different gradient angles. The required outputs are selected and multiplied by the appropriate factors in multipliers 22. The other outputs are rejected. Of course, ROM 21 may be one of the ROMs in the gradient control which already hold values for the required gradient currents.

Attention should be given to the positioning of the probes in relation to the NMR transmitting and receiving coils to reduce interaction. Considering a system geometry, in which the examined slice of the patient is in the XY plane while the orthogonal direction Z is longitudinal of the patient, it is proposed that the transmit coils be in ZX planes and the receive coils be in ZY planes. It is considered desirable to place the X probes close to the receive coils and the Y probes close to the transmit coils. However while transmitting it would still be desirable either to switch the X probes open-circuit using FET switches or to move the X probes well away from the transmit coils and to excite them with a separate 90° pulsed field (but this latter step may put them outside the region of uniform field gradient).

Figure 2:
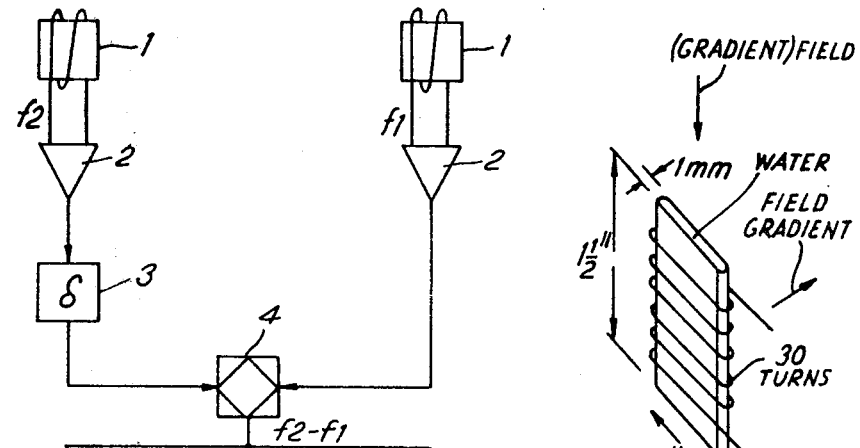
Figure 2:
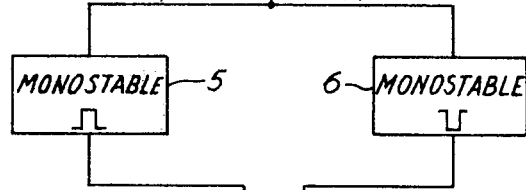
Figure 4:
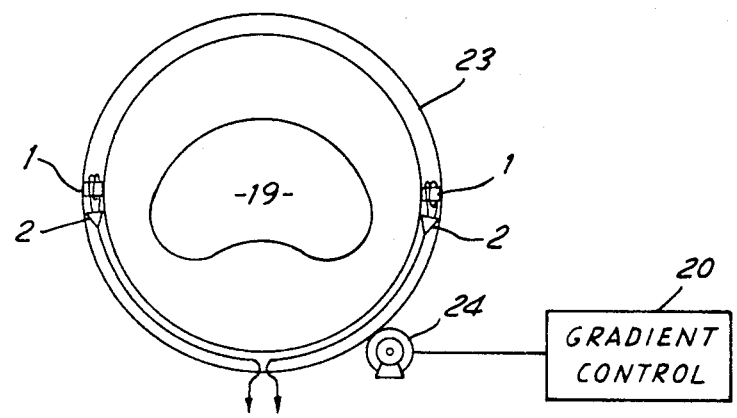
FIG. 4 shows a rotating probe arrangement for a rotating gradient.

In an alternative embodiment shown in FIG. 4 only two probes 1 are mounted on a frame 23 which is rotatable about the body 19 with a stepping motor 24 to rotate the frame 23 to the same angular position as the field gradient. For this purpose the motor is responsive to gradient control circuit 20. This keeps the probes aligned with the field gradient so that the outputs of the probes can be used directly at all times to control the correct sampling. The probe shown in FIG. 2 is particularly suitable for this arrangement.

Other embodiments of the invention will be apparent to those skilled in the art. For example one of the probe pair could carry orthogonal coils giving sine and cosine signals to separately demodulate the signal from the other probe and readily give the phase difference between the two probes. This would allow sampling at points other than the zero-crossing.

What we claim is:

1. An nuclear magnetic resonance apparatus using a field gradient to produce phase dispersion of resonating nuclei in a selected region of a body and including, a sampling arrangement for determining times of sampling signals produced by said nuclei, which times are spaced such that the gradient field integral in each interval between sampling times is substantially equal, said arrangement including two NMR probes displaced in the direction of said gradient to produce NMR signals at frequencies representing the fields at their respective positions, means for determining the phase difference between signals from the probes and means for producing a sampling signal each time the phase difference attains a predetermined value.

2. An arrangement according to claim 1 wherein the means for producing a sampling signal is arranged to do so each time the phase difference is zero.

3. An arrangement according to claim 1 wherein the means for determining the phase difference is a demodulator.

4. An arrangement according to claim 3 in which the means for producing a sampling signal is arranged to do so at zero-crossing of the output of the demodulator.

5. An arrangement according to claim 3 including means for multiplying the output of the demoulator prior to applying said output to the means for producing a sampling signal, by a chosen factor to change the sampling rate.

6. An arrangement according to claim 1 having two pairs of said probes, one pair being displaced in a direction at substantially 90° to the direction of displacement of the other pair and means, adapted for use in a nuclear magnetic resonance apparatus in which the direction of said gradient field is variable, to determine sampling times from the outputs of the two probes whose direction of displacement is closest to the direction of the gradient field at any time.

7. An arrangement according to claim 6 including means for multiplying the probe outputs by factors related to the deviation of the direction of the gradient field from the direction of displacement of the two probes.

8. An arrangement according to claims 1, 2, 3, 4 or 5 for use with a nuclear magnetic resonance apparatus in which the direction of the gradient field is variable wherein the probes are mounted for rotation about an axis to align their direction of displacement with the gradient field.

9. A nuclear magnetic resonance imaging apparatus including means using a field gradient to produce dispersion of resonating nuclei in a selected region of a body and further including a sampling arrangement of claim 1.

* * * * *